United States Patent
Xie et al.

(10) Patent No.: US 12,041,808 B2
(45) Date of Patent: Jul. 16, 2024

(54) ELECTROLUMINESCENT DISPLAY SUBSTRATE, MANUFACTURING METHOD THEREOF, AND ELECTROLUMINESCENT DISPLAY DEVICE

(71) Applicant: BOE Technology Group Co., Ltd., Beijing (CN)

(72) Inventors: Chunyan Xie, Beijing (CN); Song Zhang, Beijing (CN); Ziyu Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 783 days.

(21) Appl. No.: 17/255,107

(22) PCT Filed: Apr. 3, 2020

(86) PCT No.: PCT/CN2020/083256
§ 371 (c)(1),
(2) Date: Dec. 22, 2020

(87) PCT Pub. No.: WO2020/238412
PCT Pub. Date: Dec. 3, 2020

(65) Prior Publication Data
US 2021/0273194 A1    Sep. 2, 2021

(30) Foreign Application Priority Data
May 31, 2019   (CN) .................. 201910475322.4

(51) Int. Cl.
   *H10K 50/842*     (2023.01)
   *H10K 50/844*     (2023.01)
   *H10K 71/00*     (2023.01)
(52) U.S. Cl.
   CPC ....... *H10K 50/8428* (2023.02); *H10K 50/844* (2023.02); *H10K 71/00* (2023.02)

(58) Field of Classification Search
None
See application file for complete search history.

(56) References Cited

U.S. PATENT DOCUMENTS 10,224,508 B2    3/2019   Cai et al.
10,566,394 B2    2/2020   Cai
(Continued)

FOREIGN PATENT DOCUMENTS

CN    106601781 A    4/2017
CN    107068715 A    8/2017
(Continued)

OTHER PUBLICATIONS

First Office Action, including Search Report, for Chinese Patent Application No. 201910475322.4, dated Dec. 25, 2020, 15 pages.

*Primary Examiner* — William C Trapanese
(74) *Attorney, Agent, or Firm* — Westman, Champlin & Koehler, P.A.

(57) ABSTRACT

An electroluminescent display substrate includes: a base substrate; a thin film transistor; a display light-emitting element on a side of the thin film transistor away from the base substrate; an inorganic material layer between the thin film transistor and the display light-emitting element; an encapsulating structure covering the display light-emitting element; a hole, at least penetrating the encapsulating structure; at least one post spacer surrounding the hole; and an overcoat layer covering the at least one post spacer. An orthographic projection of the inorganic material layer on the base substrate at least partially overlaps with an orthographic projection of the thin film transistor on the base substrate, an orthographic projection of the at least one post spacer on the base substrate falls within an orthographic projection of the overcoat layer on the base substrate, and the overcoat layer is located in the same layer as the inorganic material layer.

18 Claims, 12 Drawing Sheets

(56) References Cited

U.S. PATENT DOCUMENTS

| | | |
|---|---|---|
| 2018/0061910 A1 | 3/2018 | Cai |
| 2018/0151834 A1* | 5/2018 | Kanaya ................ H10K 59/121 |
| 2018/0151838 A1 | 5/2018 | Park et al. |
| 2018/0342700 A1 | 11/2018 | Cai et al. |
| 2020/0313102 A1* | 10/2020 | Kim ..................... H10K 59/124 |

FOREIGN PATENT DOCUMENTS

| | | |
|---|---|---|
| CN | 107452894 A | 12/2017 |
| CN | 107808896 A | 3/2018 |
| CN | 108649133 A | 10/2018 |
| CN | 108962947 A | 12/2018 |
| CN | 110212113 A | 9/2019 |

\* cited by examiner

ELECTROLUMINESCENT DISPLAY SUBSTRATE, MANUFACTURING METHOD THEREOF, AND ELECTROLUMINESCENT DISPLAY DEVICE

CROSS-REFERENCE TO RELATED APPLICATIONS

This application is Section 371 National Stage application of International Application No. PCT/CN2020/083256, filed on Apr. 3, 2020, which has not yet published, and claims priority of Chinese Patent Application No. 201910475322.4 filed on May 31, 2019 in China National Intellectual Property Administration, the disclosures of which are incorporated herein by reference their entireties.

TECHNICAL FIELD

The present disclosure relates to the field of display technology, in particular to an electroluminescent display substrate, a manufacturing method thereof, and an electroluminescent display device.

BACKGROUND

With the advancement of technology, in recent years, special-shaped screens and full screens have gradually come into everyone's field of vision. Whether it is a special-shaped screen or a full screen, the purpose is to increase the screen-to-body ratio of the display device. Then, in order to achieve a higher screen-to-body ratio, some opening areas (such as holes) need to be reserved for some additional components (such as cameras, sensors, etc.) in some positions of the display screen.

For example, an electroluminescent display device such as an OLED display device usually includes an OLED device sensitive to water and oxygen. The water and oxygen easily enter the OLED device from a cut surface of the hole, thereby affecting the performance and service life of the OLED device. Therefore, improving the encapsulating reliability of display devices with holes is a key issue for developers who develop such display devices.

SUMMARY

In one aspect, an electroluminescent display substrate is provided, comprising: a base substrate; a thin film transistor on the base substrate; a display light-emitting element disposed on the base substrate and located on a side of the thin film transistor away from the base substrate; an inorganic material layer disposed on the base substrate and located between the thin film transistor and the display light-emitting element; an encapsulating structure disposed on the base substrate and covering the display light-emitting element; a hole, the hole at least penetrating the encapsulating structure; at least one post spacer on the base substrate, the at least one post spacer surrounding the hole; and an overcoat layer disposed on the base substrate and covering the at least one post spacer, wherein an orthographic projection of the inorganic material layer on the base substrate at least partially overlaps with an orthographic projection of the thin film transistor on the base substrate, an orthographic projection of the at least one post spacer on the base substrate falls within an orthographic projection of the overcoat layer on the base substrate, a material of the overcoat layer is the same as that of the inorganic material layer, and the overcoat layer is located in the same layer as the inorganic material layer.

According to exemplary embodiments, the thin film transistor comprises a source electrode and a drain electrode, and the source electrode and the drain electrode are located in a first conductive layer; the inorganic material layer comprises a second conductive layer, the display light-emitting element comprises an anode and a cathode, and the second conductive layer electrically connects the source electrode or the drain electrode to the anode or cathode of the display light-emitting element.

According to exemplary embodiments, the inorganic material layer comprises a passivation layer between the thin film transistor and the display light-emitting element.

According to exemplary embodiments, the inorganic material layer further comprises a passivation layer between the thin film transistor and the display light-emitting element; and wherein the overcoat layer comprises a first overcoat sub-layer and a second overcoat sub-layer, the first overcoat sub-layer and the second conductive layer are located in the same layer, and the second overcoat sub-layer and the passivation layer are located in the same layer.

According to exemplary embodiments, the overcoat layer contacts a first side surface, a second side surface and a top surface of each post spacer, the first side of the post spacer is a side of the post spacer close to the hole, the second side of the post spacer is a side of the post spacer away from the hole, and the top surface of the post spacer is a surface of the post spacer away from the base substrate.

According to exemplary embodiments, the electroluminescent display substrate further comprises: a first planarization layer disposed between the thin film transistor and the inorganic material layer and covering the thin film transistor; and a support layer disposed between the base substrate and the post spacer and supporting the post spacer, wherein the first planarization layer and the support layer are located in the same layer and contain the same material.

According to exemplary embodiments, the orthographic projection of the at least one post spacer on the base substrate falls within an orthographic projection of the support layer on the base substrate.

According to exemplary embodiments, an orthographic projection of the support layer on the base substrate falls within the orthographic projection of the overcoat layer on the base substrate, and the overcoat layer covers both the post spacer and the support layer.

According to exemplary embodiments, the encapsulating structure comprises: a first water blocking layer on a side of the display light-emitting element away from the base substrate; a second planarization layer on a side of the first water blocking layer away from the base substrate; and a second water blocking layer on a side of the second planarization layer away from the base substrate, wherein the first water blocking layer and the second water blocking layer comprise an inorganic material, and the second planarization layer comprises an organic material, and wherein an orthographic projection of each of the first water blocking layer and the second water blocking layer on the base substrate covers an orthographic projection of each of the overcoat layer, the post spacer and the support layer on the base substrate.

According to exemplary embodiments, an orthographic projection of one post spacer of the at least one post spacer closest to the hole on the base substrate does not overlap with an orthographic projection of the second planarization layer on the base substrate.

According to exemplary embodiments, a cross section of each post spacer in a direction perpendicular to the base substrate has a shape selected from an inverted trapezoid shape, an I-shape or a T-shape.

According to exemplary embodiments, the display light-emitting element comprises an anode, a cathode, and a light-emitting layer sandwiched between the anode and the cathode, and at least one of the light-emitting layer and the cathode is disconnected at each post spacer.

According to exemplary embodiments, the at least one post spacer comprises two or more post spacers, and the two or more post spacers are disposed on the same support layer.

According to exemplary embodiments, the at least one post spacer comprises two or more post spacers, the support layer comprises two or more support sub-layers, and the two or more support sub-layers support the two or more post spacers, respectively, so that a corner of the overcoat layer at a junction where each support sub-layer is connected with the post spacer supported by the support sub-layer has an obtuse angle.

According to exemplary embodiments, each post spacer comprises a photoresist material.

According to exemplary embodiments, the second conductive layer and the first conductive layer comprise the same material.

In another aspect, an electroluminescent display device comprising the electroluminescent display substrate according to any one of the above embodiments is provided.

In a further aspect, a manufacturing method of an electroluminescent display substrate is provided, comprising: forming a thin film transistor on a base substrate; forming a planarization film layer on a side of the thin film transistor away from the base substrate, and then forming a first planarization layer and a support layer through one patterning process; forming a post spacer on a side of the support layer away from the base substrate; forming an inorganic material film layer on a side of the first planarization layer and the post spacer away from the base substrate, and then forming an inorganic material layer and an overcoat layer through one patterning process; forming a display light-emitting element on a side of the inorganic material layer and the overcoat layer away from the base substrate; forming an encapsulating structure on a side of the display light-emitting element away from the base substrate; and forming a hole that at least penetrates the encapsulating structure in an area surrounded by the post spacer, wherein an orthographic projection of the inorganic material layer on the base substrate at least partially overlaps with an orthographic projection of the thin film transistor on the base substrate, and an orthographic projection of the post spacer on the base substrate falls within an orthographic projection of the overcoat layer on the base substrate.

According to exemplary embodiments, the thin film transistor comprises a source electrode and a drain electrode, and the source electrode and the drain electrode are located in the first conductive layer; the inorganic material layer comprises a second conductive layer, the display light-emitting element comprises an anode and a cathode, and the second conductive layer electrically connects the source electrode or the drain electrode to the anode or cathode of the display light-emitting element.

According to exemplary embodiments, the inorganic material layer comprises a passivation layer between the thin film transistor and the display light-emitting element.

According to exemplary embodiments, the inorganic material layer further comprises a passivation layer between the thin film transistor and the display light-emitting element; and wherein the overcoat layer comprises a first overcoat sub-layer and a second overcoat sub-layer, the first overcoat sub-layer and the second conductive layer are located in the same layer, and the second overcoat sub-layer and the passivation layer are located in the same layer.

BRIEF DESCRIPTION OF THE DRAWINGS

In order to explain technical solutions of the embodiments of the present disclosure more clearly, the drawings of the embodiments will be briefly described below. It should be understood that the drawings described below only relate to some embodiments of the present disclosure, rather than limiting the present disclosure, wherein.

Figure 1:
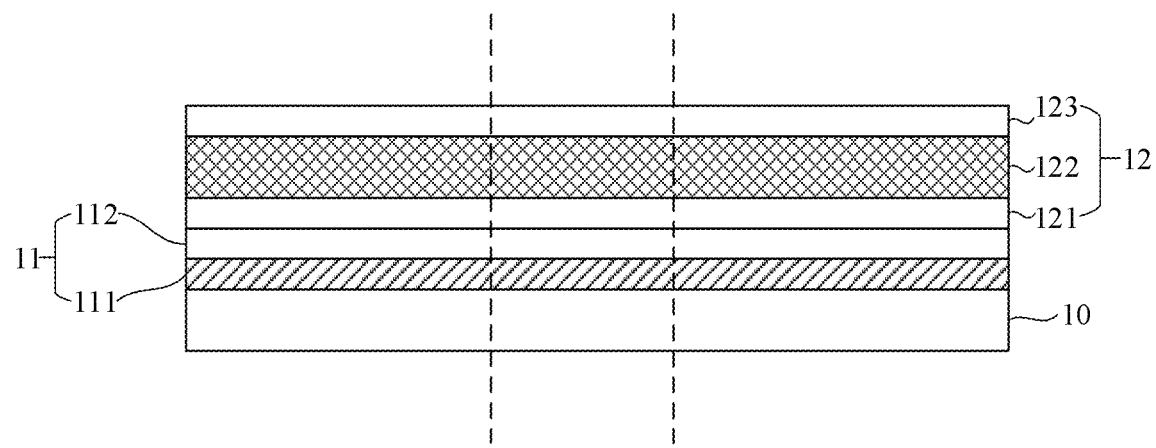
FIG. 1 is a schematic cross-sectional view of an electroluminescent display device.

It should be noted that, for clarity, in the drawings used to describe the embodiments of the present disclosure, sizes of layers, structures, or regions may be enlarged or reduced, that is, these drawings are not drawn according to actual scale.

DETAILED DESCRIPTION OF EMBODIMENTS

In the following, technical solutions of the present disclosure will be further described in detail through embodiments in conjunction with the drawings. In the specification, the same or similar reference numerals indicate the same or similar components. The following description of the embodiments of the present disclosure with reference to the accompanying drawings is intended to explain the general inventive concept of the present disclosure, and should not be understood as limiting the present disclosure.

In addition, in the following detailed description, for the convenience of explanation, many specific details are set forth to provide a comprehensive understanding of the embodiments of the present disclosure. Obviously, however, one or more embodiments may also be implemented without these specific details.

It should be noted that "on", "formed on" and "disposed on" in this context may mean that a layer is directly formed or disposed on another layer, or may mean that a layer is formed indirectly or disposed on another layer, that is, there are other layers between the two layers.

It should be noted that although terms "first", "second" and the like may be used herein to describe various components, members, elements, regions, layers and/or parts, these components, members, elements, regions, and layers and/or parts should not be limited by these terms. Rather, these terms are used to distinguish one component, member, element, region, layer, and/or part from another. Thus, for example, the first component, the first member, the first element, the first region, the first layer, and/or the first part discussed below may be referred to as the second component, the second member, the second element, the second region, the second layer and/or the second part without departing from the teachings of the present disclosure.

In this context, unless otherwise specified, an expression "located in the same layer" means that two layers, components, members, elements or parts may be formed by the same patterning process, and the two layers, components, members, elements or parts are generally formed of the same material.

In this context, unless otherwise specified, an expression "patterning process" generally includes steps of photoresist coating, exposure, development, etching, and photoresist stripping. An expression "one patterning process" means a process of forming patterned layers, components, members or the like by using one mask.

As shown in FIG. 1, an electroluminescent display device such as an OLED display device includes: a base substrate 10, a display light-emitting element 11 located on the base substrate 10, and an encapsulating layer 12 covering the display light-emitting element 11. Wherein, the display light-emitting element 11 may include a circuit layer 111 and an OLED device layer 112 located on the circuit layer 111. For example, the circuit layer 111 may include various circuits and conductive traces for driving the display light-emitting element, and the OLED device layer 112 may include an anode, a cathode, and various functional layers. For example, various functional layers may include an electron injection layer, an electron transport layer, a hole injection layer, a hole transport layer, an organic light-emitting layer, and the like. The encapsulating layer 12 may include a film layer formed of an inorganic layer and an organic layer that are alternately provided. For example, the encapsulating layer may include a first water blocking layer 121, a planarization layer 122, and a second water blocking layer 123 arranged in sequence. For example, the first water blocking layer 121 and the second water blocking layer 123 may include an inorganic material, and the planarization layer 122 may include an organic material.

In order to increase the screen-to-body ratio of a display, a full screen has attracted the attention of developers. For this type of display screen, it is necessary to form a hole on the display screen. For example, the hole may be formed at a position where two dotted lines in FIG. 1 are located to obtain the structure shown in FIG. 2, so as to reserve installation positions for hardware, such as front camera or home button, on a terminal device.

Figure 2:
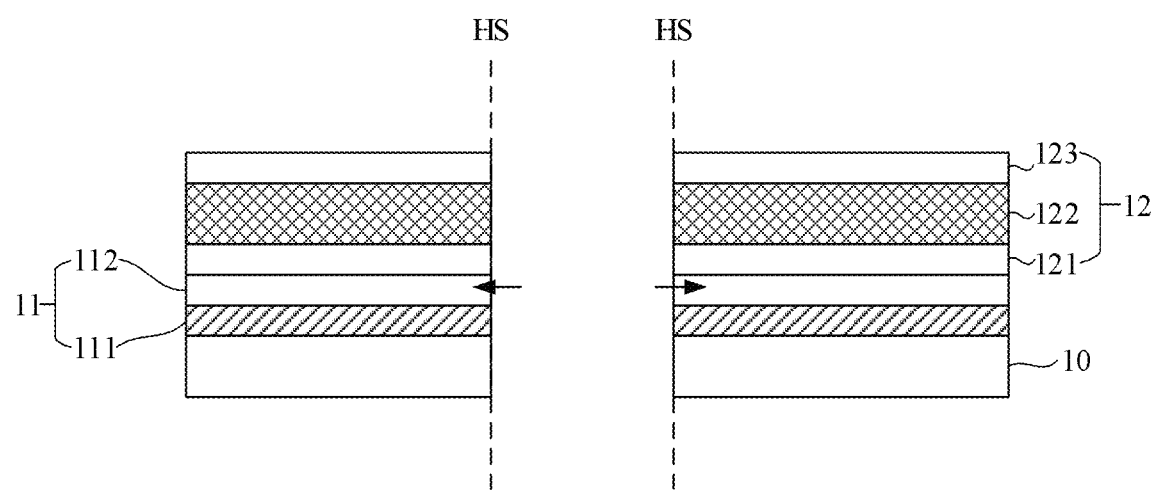
FIG. 2 is a schematic cross-sectional view of a structure of the display device shown in FIG. 1 after forming a hole.
Figure 3:
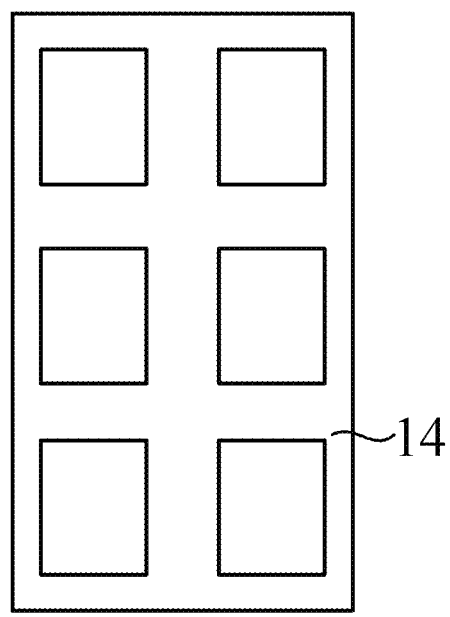
FIG. 3 is a schematic structural view of a mask used in an evaporation process for forming a film layer of a display light-emitting element.

However, OLED devices are very sensitive to water vapor and oxygen. The water vapor and oxygen invading into the device are a main factor that affects the service life of the OLED devices. Therefore, encapsulation is very important for the OLED devices. Referring to FIG. 2, for a display device with a hole, the water vapor and oxygen may easily invade the display light-emitting elements through a cut surface HS at the hole, as shown by the arrow in FIG. 2, directly invade the display light-emitting elements located in the display area, resulting in encapsulation failure of OLED display device, thereby affecting display effect of the OLED display device and seriously affecting the service life of the OLED display device. In the related art, various functional layers and the cathode in the OLED device layer 112 are usually formed by an evaporation process. FIG. 3 schematically shows the mask 14 used in the evaporation process. As shown in FIG. 3, the mask 14 has an open mask structure, and a shielding structure cannot be formed in the opening area of the mask 14, as a result, after punching a hole on the OLED display device subsequently, the display light-emitting elements located at the cut surface of the hole (the cut surface HS in FIG. 2) may not be protected by the encapsulating layer. The water and oxygen may enter the interior of the display light-emitting elements through the cut surface, resulting in the encapsulation failure of the OLED display device, thereby affecting the display effect of the OLED display device and seriously affecting the service life of the OLED display device.

Figure 4:
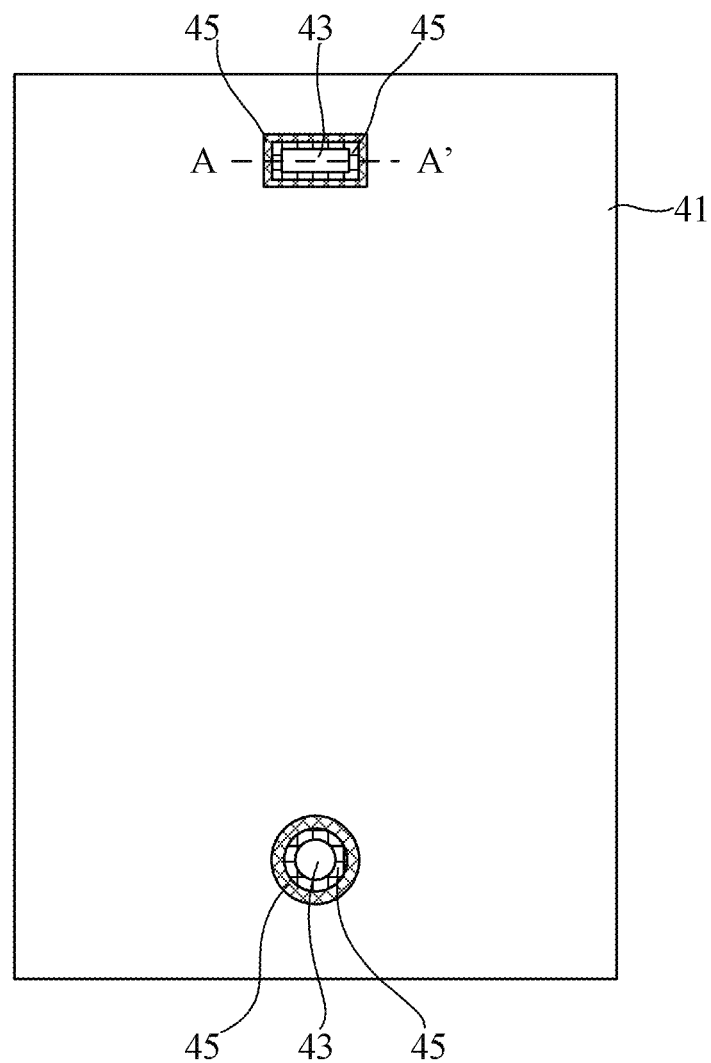
FIG. 4 is a plan view of an electroluminescent display substrate according to exemplary embodiments of the present disclosure.
Figure 5:
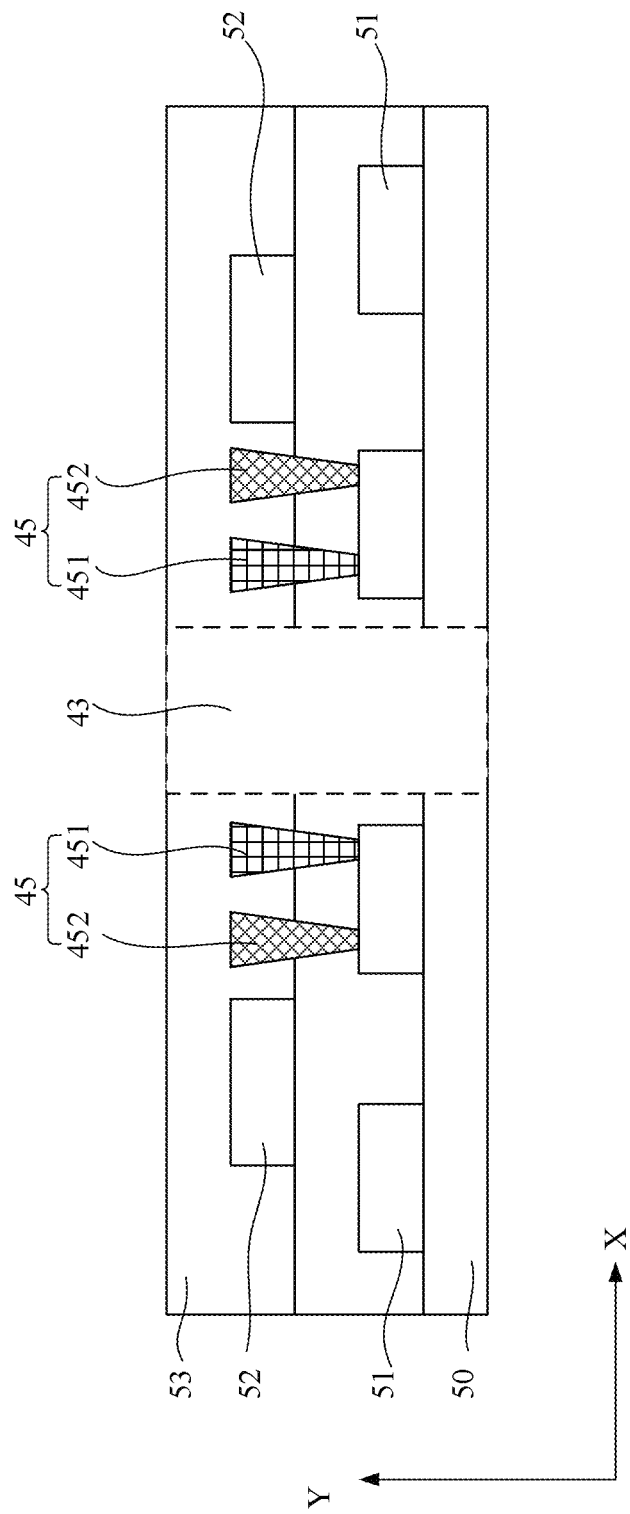
FIG. 5 is a schematic cross-sectional view, taken along line A-A' in FIG. 4, of an electroluminescent display substrate according to exemplary embodiments of the present disclosure.
Figure 6:
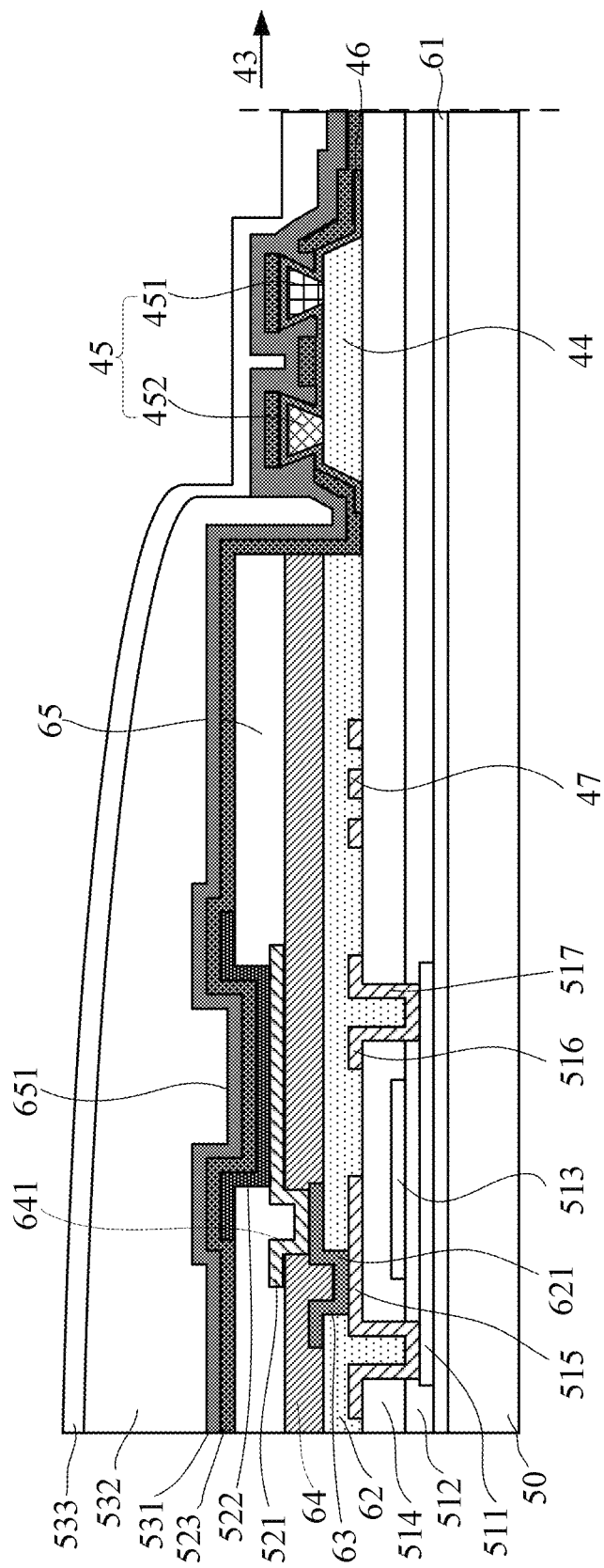
FIG. 6 is a partial cross-sectional view, taken along the line A-A' in FIG. 4, of an electroluminescent display substrate according to exemplary embodiments of the present disclosure.

FIG. 4 shows a plan view of an electroluminescent display substrate according to exemplary embodiments of the present disclosure. FIG. 5 is a schematic cross-sectional view of an electroluminescent display substrate according to exemplary embodiments of the present disclosure taken along line AA' in FIG. 4. FIG. 6 is a partial cross-sectional view of an electroluminescent display substrate according to exemplary embodiments of the present disclosure taken along line AA' in FIG. 4. As shown in FIG. 4, the electroluminescent display substrate includes a display area 41 and at least one hole 43 located in the display area 41. In FIG. 4, two holes 43 are provided as an example for illustration. It should be understood that the embodiments of the present disclosure are not limited to this. In other embodiments, fewer (for example, one) or more holes 43 may be provided.

It should be noted that the "hole" mentioned in this context is an area on the display substrate for installing the hardware structure. For the convenience of description, a name "hole" is used in this context, and the hole includes but is not limited to the following forms: through hole, groove, opening, etc. Optionally, the hardware structure may include one or more of the following structures: a front camera, a home key, an earpiece, or a speaker. The specific installation method of the hardware structure is not particularly limited in the embodiments of the present disclosure. In addition, the shape of the hole may be determined according to the shape of the hardware structure to be installed. For example, a cross section of the hole in a direction parallel to the base substrate of the display substrate may have one or more of the following shapes: circle, ellipse, rectangle, rounded rectangle, square, diamond, trapezoid, etc.

As shown in FIG. 5, the display substrate includes: a base substrate 50, and a thin film transistor (abbreviated as TFT) 51, a display light-emitting element 52 and an encapsulating structure 53 sequentially arranged on the base substrate 50. For example, the hole 43 penetrates the base substrate and various film layers on the display substrate in a direction perpendicular to the base substrate 50.

Optionally, the display substrate according to the embodiments of the present disclosure is applicable for full-screen and frameless display panels. For example, the display substrate may be an OLED display substrate. The thin film transistor may be a top-gate type TFT or a bottom-gate type TFT. The display light-emitting element 52 may include an anode, a light-emitting layer, and a cathode. The encapsulating structure 53 may be a thin film encapsulating structure (TFE). It should be noted that the display substrate may also include some other film layers, for example, a conductive layer, a planarization layer, a passivation layer, etc., which will be further described below. In the embodiments, the hole 43 may be arranged in the display area, that is, the hardware structure is installed in the display area, so that the frame may be reduced, the effective area of the display area may be increased, and the fabrication of a full screen may be realized. A rectangular area 43 located in the middle position in FIG. 5 and enclosed by the dashed frame is the position of the hole, and the hole 43 penetrates the base substrate 50 and various film layers in the direction perpendicular to the base substrate 50 (i.e., Y-axis direction in FIG. 5) to form the structure shown in FIG. 5. Of course, the embodiments of the present disclosure are not limited to this, the hole may also be set to only penetrate film layers except the base substrate in the Y-axis direction as required, and the specific penetrating part of the hole may be set as required, which is not specifically limited here.

Referring to FIGS. 4 and 5, the display substrate includes at least one post spacer 45 disposed around the hole 43. The post spacer 45 may block water vapor and oxygen to prevent the water vapor and oxygen from invading the display light-emitting elements through the cut surface of the hole 43.

As an example, FIG. 4 shows that two holes are provided. In the plan view of FIG. 4, the hole includes a closed-ring pattern, and the post spacer 45 is arranged around the hole 43. Therefore, the post spacer 45 also includes a closed-ring pattern. In addition, when viewed from a plan view, the shape of the post spacer 45 is consistent with the shape of the hole 43. For example, the lower hole 43 in FIG. 4 is circular and the corresponding post spacer 45 is also circular, the upper hole 43 is rectangular and the corresponding post spacer 45 is also rectangular.

Hereinafter, the embodiments of the present disclosure will be described in further detail by taking an example that the display substrate may be an OLED display substrate and the thin film transistor is a top-gate TFT.

Referring to FIGS. 5 and 6, the display substrate includes a buffer layer 61 disposed on the base substrate 50, and the thin film transistor 51 is disposed on a side of the buffer layer 61 away from the base substrate 50. The thin film transistor 51 includes an active layer 511 arranged on the side of the buffer layer 61 away from the base substrate 50, a gate insulating layer 512 arranged on a side of the active layer 511 away from the base substrate 50, and a gate electrode 513 arranged on a side of the gate insulating layer 512 away from the base substrate 50, an interlayer dielectric layer 514 arranged on a side of the gate electrode 513 away from the base substrate 50 and covering the gate electrode 513, and a first conductive layer arranged on a side of the interlayer dielectric layer 514 away from the base substrate 50. The first conductive layer may include a source electrode 515 and a drain electrode 516 of the thin film transistor as well as conductive plugs 517 formed in via holes penetrating the interlayer dielectric layer 514. The source electrode 515 and the drain electrode 516 of the thin film transistor are electrically connected to the active layer 511 through respective conductive plugs 517.

Referring to FIG. 6, the display substrate further includes a pixel defining layer 65, and the pixel defining layer 65 defines an opening area 651, and the display light-emitting element 52 may be located in the opening area 651. The display light-emitting element 52 may include an anode 521, a light-emitting layer 522, and a cathode 523, and the light-emitting layer 522 is sandwiched between the anode 521 and the cathode 523. It should be noted that the "light-emitting layer" here is a generalized name of various functional layers of the OLED display light-emitting element, for example, it may include various functional layers such as an electron injection layer, an electron transport layer, a hole injection layer, a hole transport layer, and an organic light-emitting layer.

The display substrate further includes various film layers arranged between the thin film transistor 51 and the display light-emitting element 52. For example, the various film layers may include a first planarization layer 62 disposed on a side of the first conductive layer away from the base substrate 50 and covering the first conductive layer, a second conductive layer 63 disposed on a side of the first planarization layer 62 away from the base substrate 50, and a passivation layer 64 disposed on a side of the second conductive layer 63 away from the base substrate 50 and covering the second conductive layer 63. For example, the first planarization layer 62 may be composed of an organic material, and the second conductive layer 63 and the passivation layer 64 may both be composed of an inorganic material. Therefore, in this context, the second conductive layer 63 and the passivation layer 64 may be referred to as inorganic material layers.

For example, the second conductive layer 63 may be composed of the same conductive material as the first conductive layer. The second conductive layer 63 may be electrically connected to the source electrode or drain electrode of the thin film transistor through a conductive plug 621 formed in a via hole penetrating the first planarization layer 62. The anode 521 or the cathode 523 may be electrically connected to the second conductive layer 63 through a conductive plug 641 formed in the via hole penetrating the passivation layer 64. For example, in the illustrated embodiments, the second conductive layer 63 is electrically connected to the drain electrode 516, and the anode 521 is electrically connected to the second conductive layer 63. In this way, the anode 521 and the drain electrode 516 are electrically connected.

Further referring to FIG. 6, the encapsulating structure 53 may include film layers which include an inorganic layer and an organic layer alternately disposed, for example, it may include a first water blocking layer 531, a second planarization layer 532, and a second water blocking layer 533 arranged in sequence. For example, the first water blocking layer 531 and the second water blocking layer 533 may be composed of an inorganic material, and the second planarization layer 532 may be composed of an organic material.

As shown in FIG. 6, the display substrate further includes a support layer 44. The support layer 44 may be disposed on the side of the interlayer dielectric layer 514 away from the base substrate 50 to support the post spacer 45. Optionally, the support layer 44 may be located in the same layer as the first planarization layer 62. The post spacer 45 is disposed on the support layer 44. Specifically, the post spacer 45 may be disposed on a surface of the support layer 44 away from the interlayer dielectric layer 514, and a surface of the post spacer 45 facing the support layer 44 may be in contact with a surface of the support layer 44 away from interlayer the dielectric layer 514. An orthographic projection of the post spacer 45 on the base substrate 50 falls within an orthographic projection of the support layer 44 on the base substrate 50.

Figure 7:
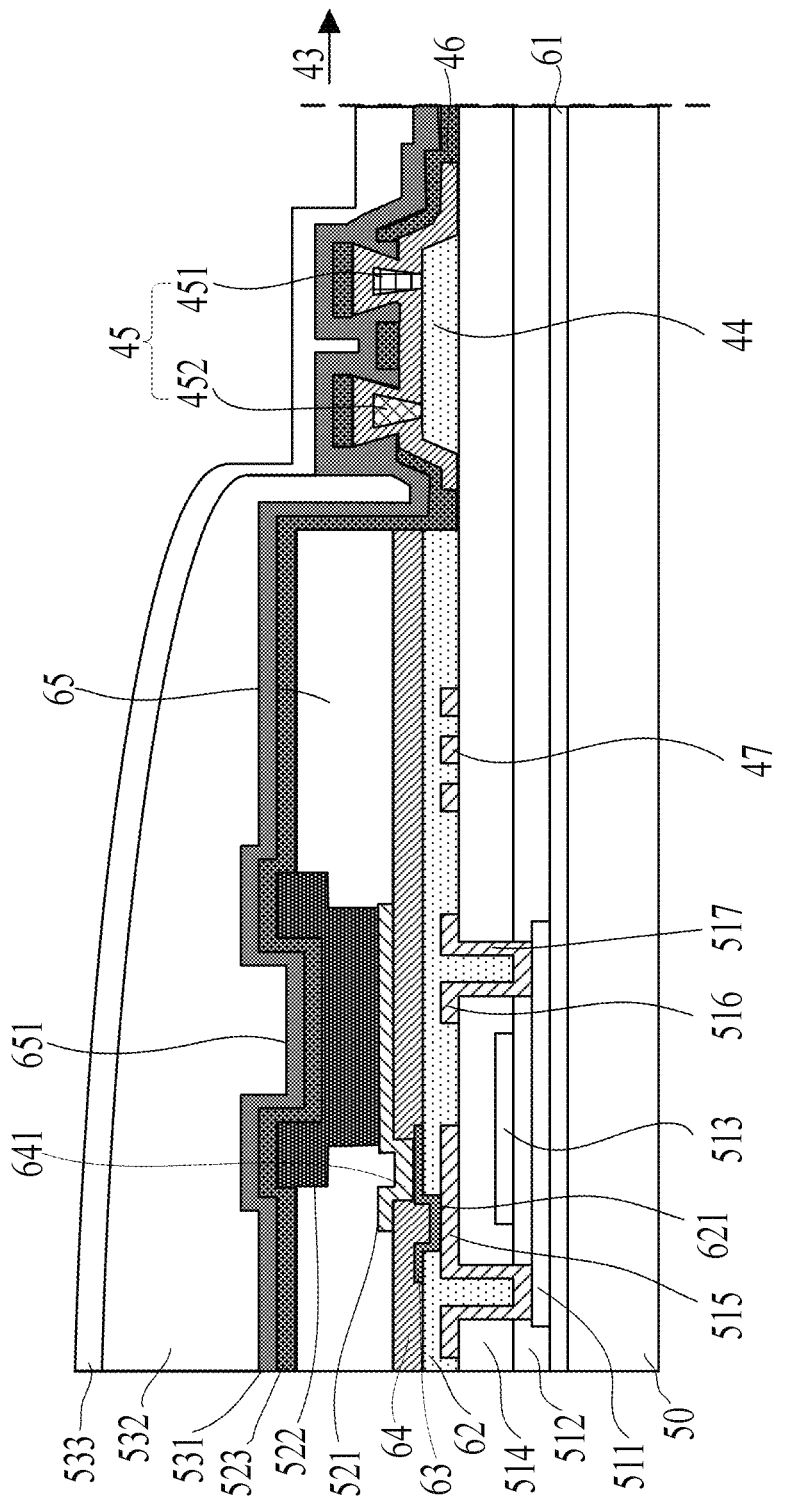
FIG. 7 is a partial cross-sectional view, taken along the line A-A' in FIG. 4, of an electroluminescent display substrate according to other exemplary embodiments of the present disclosure.
Figure 8:
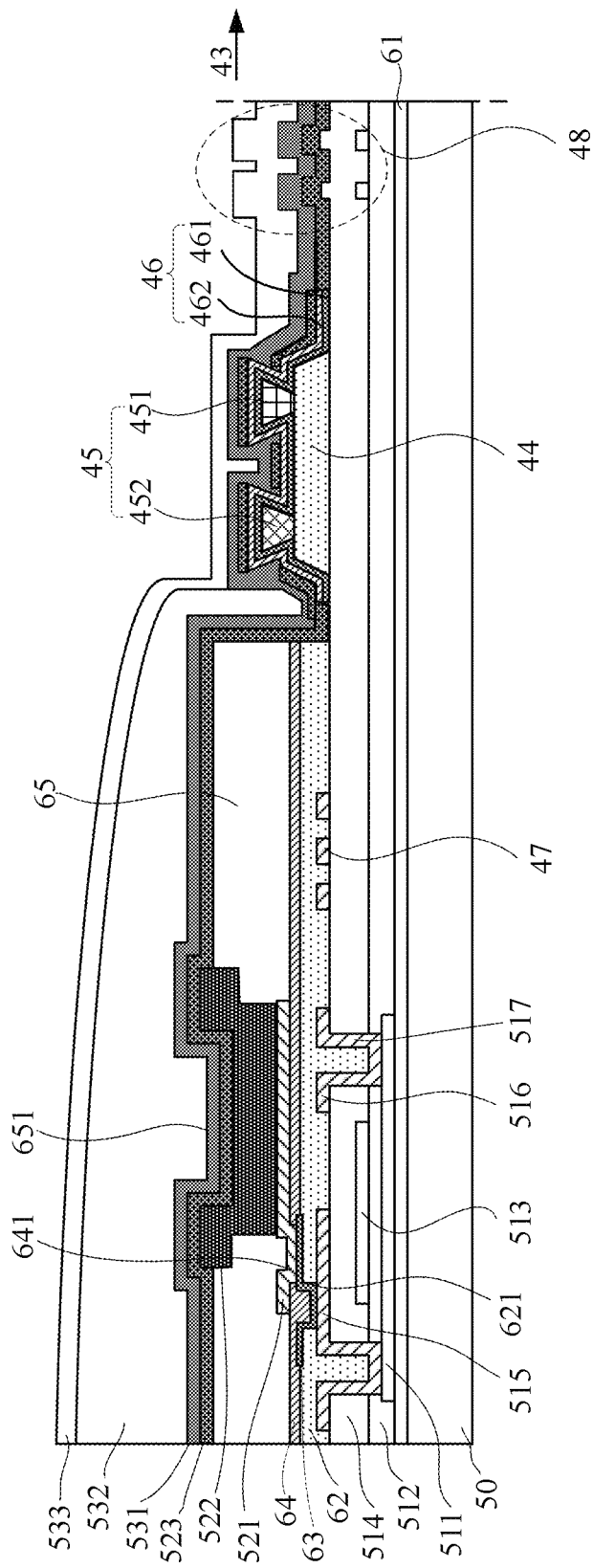
FIG. 8 is a partial cross-sectional view, taken along the line A-A' in FIG. 4, of an electroluminescent display substrate according to still other exemplary embodiments of the present disclosure.

Further referring to FIG. 6, the display substrate further includes an overcoat layer 46 covering the post spacer 45. For example, the overcoat layer 46 may be made of an inorganic material, and the overcoat layer 46 covers side surfaces of the post spacer 45 and a surface of the post spacer 45 away from the support layer 44. That is, the overcoat layer 46 contacts a first side surface of the post spacer 45 close to the hole 43, a second side surface of the post spacer 45 away from the hole 43, and the surface of the post spacer 45 away from the base substrate (that is, a top surface of the post spacer 45). As shown in FIGS. 6-8, an orthographic projection of the overcoat layer 46 on the base substrate 50 covers the orthographic projection of the post spacer 45 on the base substrate 50. In this way, the post spacer 45 is formed as a water blocking structure as a whole to further prevent water vapor and oxygen from invading the display light-emitting elements through the cut surface of the hole 43.

For example, the material of the post spacer 45 may be photoresist, such as a negative photoresist, and the pattern of the post spacer 45 may be obtained through a photolithography process.

In the embodiments of the present disclosure, the overcoat layer 46 may have a single-layer structure, and the overcoat layer 46 may be located in the same layer as the second conductive layer 63. For example, the overcoat layer 46 and the second conductive layer 63 may be made of the same material as the source electrode and drain electrode of the thin film transistor. In this way, the overcoat layer 46 and the second conductive layer 63 may be formed of the same material and through the same patterning process, that is, there is no need to increase the number of patterning processes to form the overcoat layer separately, which is beneficial to save the number of patterning processes and to reduce the manufacturing difficulty and cost.

Optionally, referring to FIG. 7, the overcoat layer 46 may have a single-layer structure, and the overcoat layer 46 may be located in the same layer as the passivation layer 64. For example, the overcoat layer 46 and the passivation layer 64 may be composed of an inorganic material such as silicon oxide, silicon nitride, and the like. In this way, the overcoat layer 46 and the passivation layer 64 may be formed of the same material and through the same patterning process, that is, there is no need to increase the number of patterning processes to form the overcoat layer separately, which is beneficial to save the number of patterning processes and to reduce the manufacturing difficulty and cost.

Optionally, referring to FIG. 8, the overcoat layer 46 may have a multilayer structure, and the overcoat layer 46 may include a first overcoat sub-layer 461 and a second overcoat sub-layer 462, wherein the first overcoat sub-layer 461 may be located in the same layer as the second conductive layer 63, and the second overcoat sub-layer 462 may be located in the same layer as the passivation layer 64. In this way, the first overcoat sub-layer 461 and the second conductive layer 63 may be formed of the same material and through the same patterning process, and the second overcoat sub-layer 462 and the passivation layer 64 may be formed of the same material and through the same patterning process. In other words, there is no need to increase the number of patterning processes to form the overcoat layer separately, which is beneficial to save the number of patterning processes and to reduce the manufacturing difficulty and cost. In addition, multiple inorganic material layers are used to cover the post spacer, thereby further improving the ability of the post spacer to block water vapor and oxygen from invading the display light-emitting elements through the cut surface of the hole.

In the embodiments of the present disclosure, a laminated structure including the support layer, the post spacer and the overcoat layer is formed. Since the support layer is provided under the post spacer, it is advantageous for the overcoat layer provided in the same layer as the inorganic material layer to cover the post spacer, thereby facilitating that the post spacer as a whole is formed into a water blocking structure.

Referring to FIGS. 6-8, the cathode 523 of the light-emitting element 52 is also formed on the overcoat layer 46, that is, an orthographic projection of the cathode 523 of the light-emitting element 52 on the base substrate 50 overlaps with an orthographic projection of the overcoat layer 46 on the base substrate 50. In addition, the orthographic projection of the cathode 523 of the display light-emitting element 52 on the base substrate 50 overlaps with the orthographic projection of the post spacer 45 on the base substrate 50.

Optionally, the light-emitting layer 522 and the cathode 523 of the display light-emitting element 52 are further formed on the overcoat layer 46, that is, an orthographic projection of each of the light-emitting layer 522 and the cathode 523 of the display light-emitting element 52 on the base substrate 50 overlaps with the orthographic projection of the overcoat layer 46 on the base substrate 50. In addition, the orthographic projection of each of the light-emitting layer 522 and the cathode 523 of the display light-emitting element 52 on the base substrate 50 overlaps with the orthographic projection of the post spacer 45 on the base substrate 50.

Further referring to 6-8, the cross section of the post spacer 45 in the direction perpendicular to the base substrate 50 may have an inverted trapezoid shape, that is, an area of the cross section of the post spacer 45 in the direction parallel to the base substrate 50 gradually increases. In this way, when various film layers of the display light-emitting element 52 (for example, the light-emitting layer 522 and the cathode 523) are formed by an evaporation process, the various film layers of the display light-emitting element 52 may be disconnected at the post spacer 45, for example, as shown in FIGS. 6-8, the cathode 523 of the display light-emitting element 52 is disconnected at the post spacer 45. Alternatively, both the light-emitting layer 522 and the cathode 523 of the display light-emitting element 52 may be disconnected at the post spacer 45. Therefore, the water vapor and oxygen will not penetrate the interior of the display light-emitting element along the film layer (such as the light-emitting layer or the cathode) of the display light-emitting element through the cut surface of the hole 43, which further improves the encapsulating reliability of the display light-emitting elements.

Figure 9A:
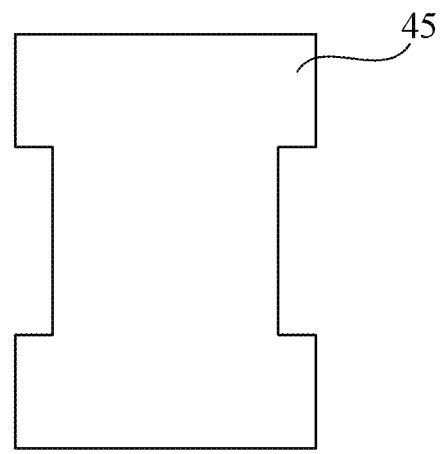
FIGS. 9A and 9B are schematic cross-sectional views of a post spacer of an electroluminescent display substrate according to exemplary embodiments of the present disclosure.
Figure 9B:
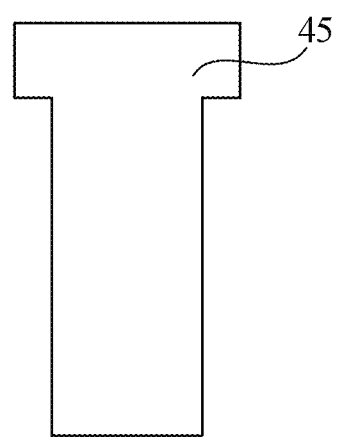

Optionally, the cross section of the post spacer 45 in the direction perpendicular to the base substrate 50 may have other shapes, for example, I-shape shown in FIG. 9A and T-shape shown in FIG. 9B. That is, there is a convex structure on a side surface of the post spacer 45. In other words, a cross section of the post spacer 45 in the direction parallel to the base substrate 50 at a first position has a first cross-sectional area, and a cross section of the post spacer 45 in the direction parallel to the base substrate 50 at a second position has a second cross-sectional area, the first position is farther away from the support layer 44 than the second position, and the first cross-sectional area is larger than the second cross-sectional area. In this way, respective film layers of the display light-emitting element 52 are disconnected at the post spacer 45. For example, as shown in FIGS. 6-8, the light-emitting layer 522 and the cathode 523 of the display light-emitting element 52 are disconnected at the post spacer 45. Therefore, the water vapor and oxygen may not invade the interior of the display light-emitting element along the film layers of the display light-emitting element through the cut surface of the hole 43, which further improves the encapsulating reliability of the display light-emitting elements.

Referring to FIGS. 6-8, the encapsulating structure 53 may cover the post spacer 45 and the overcoat layer 46. For example, the first water blocking layer 531 and the second water blocking layer 533 of the encapsulating structure 53 cover the post spacer 45 and the overcoat layer 46.

Specifically, each of the first water blocking layer 531, the second planarization layer 532, and the second water blocking layer 533 of the encapsulating structure 53 is located above the display light-emitting elements 52 to cover the display light-emitting elements 52. As shown in FIGS. 6-8, an orthographic projection of each film layer of the display light-emitting element 52 on the base substrate 50 falls within an orthographic projection of each of the first water blocking layer 531, the second planarization layer 532, and the second water blocking layer 533 on the base substrate 50. In this way, the encapsulating structure 53 may encapsulate the display light-emitting element 52.

In addition, the first water blocking layer 531 and the second water blocking layer 533 of the encapsulating structure 53 extend from a position above the display light-emitting elements 52 to an edge of the hole 43, so that the orthographic projection of each of the support layer 44, the post spacer 45 and the overcoat layer 46 on the base substrate 50 falls within the orthographic projection of each of the first water blocking layer 531 and the second water blocking layer 533 of the encapsulating structure 53 on the base substrate 50. In this way, the water vapor and oxygen may be better prevented from invading the interior of the display light-emitting element through the cut surface of the hole 43, which further improves the encapsulating reliability of the display light-emitting elements.

For example, referring to FIGS. 4 and 6-8 in combination, one hole 43 may be surrounded by two post spacers 45 to improve the ability of the post spacers to prevent water and oxygen from invading. It should be noted that the embodiments of the present disclosure are not limited to this, and fewer post spacers 45 (for example, one) or more post spacers 45 may be provided to surround one hole 43 according to actual needs. In the embodiments of the present disclosure, regardless of the number of post spacers 45, the overcoat layer 46 covers the side surfaces of each post spacer 45 and the surface of each post spacer 45 away from the support layer 44. As shown in FIGS. 6-8, the orthographic projection of the overcoat layer 46 on the base substrate 50 covers the orthographic projection of each post spacer 45 on the base substrate 50. In this way, the post spacer 45 is integrally formed as a water blocking structure to further prevent water vapor and oxygen from invading the display light-emitting elements through the cut surface of the hole 43.

For example, in the embodiments shown in FIGS. 6-8, a post spacer 45 close to the hole 43 may be referred to as a first post spacer 451, and a post spacer 45 distal to the hole 43 may be referred to as a second post spacer 452. That is, the first post spacer 451 is closer to the hole 43 than the second post spacer 452. Referring to FIGS. 6-8, the second planarization layer 532 of the encapsulating structure 53 extends from a position above the display light-emitting elements 52 to a position above the second post spacer 452, for example, the second planarization layer 532 may extend to a position where a side surface of the second post spacer 452 away from the hole 43 is located, that is, an orthographic projection of each of the first post spacer 451 and the second post spacer 452 on the base substrate 50 does not completely fall within the orthographic projection of the second planarization layer 532 on the base substrate 50.

Figure 10:
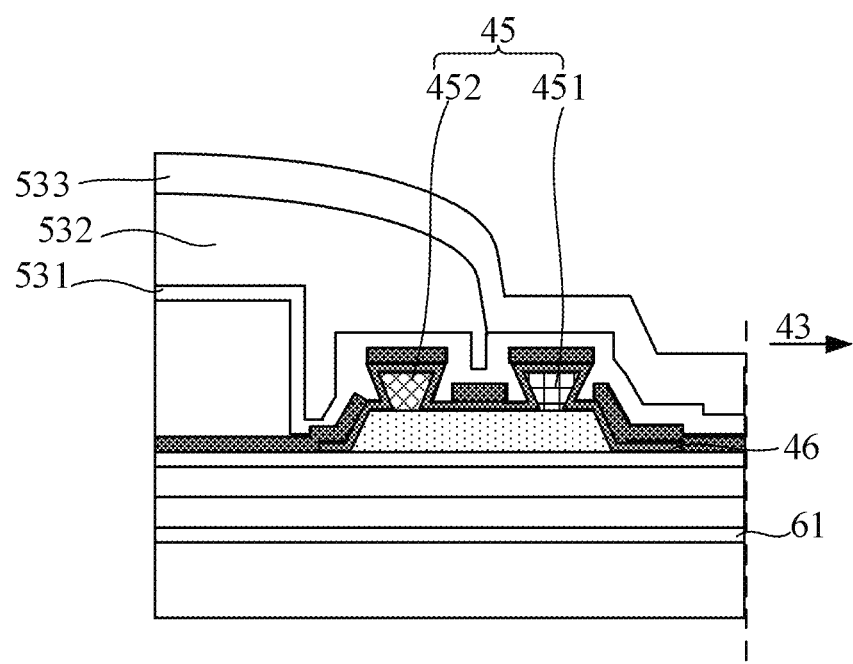
FIG. 10 is a partial enlarged view of an electroluminescent display substrate according to exemplary embodiments of the present disclosure, in which a relative relationship between the encapsulating structure and the post spacer is shown.

Optionally, referring to FIG. 10, the second planarization layer 532 of the encapsulating structure 53 extends from a position above the display light-emitting elements 52 to a position close to above the first post spacer 451. For example, the second planarization layer 532 may extend to a position where a side surface of the first post spacer 451 away from the hole 43 is located, that is, the orthographic projection of the first post spacer 451 on the base substrate 50 does not fall within the orthographic projection of the second planarization layer 532 on the base substrate 50.

In the embodiments of the present disclosure, the second planarization layer 532 of the encapsulating structure 53 does not cover the post spacer closest to the hole 43, and the second planarization layer 532 of the encapsulating structure 53 extends to a position above the post spacer closest to the hole 43, therefore, the second planarization layer 532 does not extend to the cut surface of the hole 43. The second planarization layer 532 is made of an organic material, and the water vapor and oxygen may easily invade the interior of the display light-emitting elements through the organic material. Since the second planarization layer 532 is disconnected at the post spacer, it may better prevent the water vapor and oxygen from invading the interior of the display light-emitting elements through the cut surface of the hole 43, which further improves the encapsulating reliability of the display light-emitting elements. Moreover, the material for forming the second planarization layer 532 may be saved, and the hole 43 may be formed more easily by cutting.

Figure 11A:
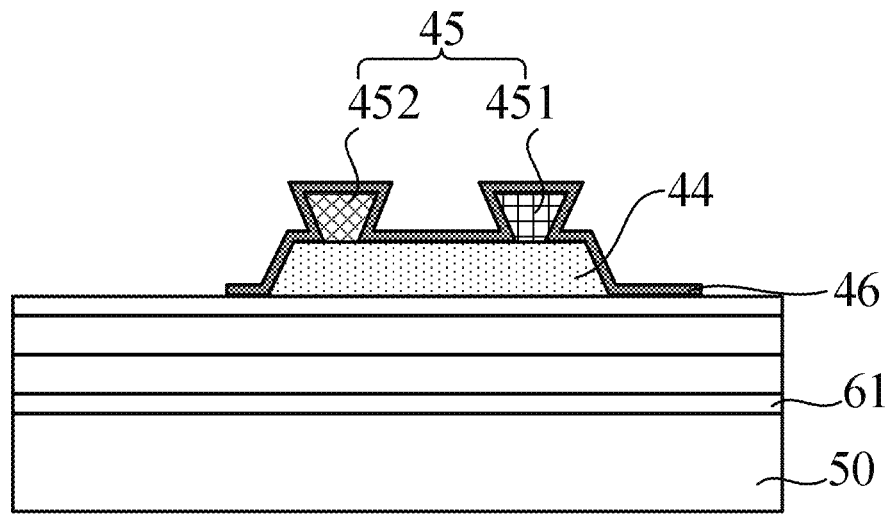
FIGS. 11A and 11B are respectively partial enlarged views of a cross-sectional view of a display substrate according to embodiments of the present disclosure, in which the shape and relative positional relationship of the support layer and the post spacer are mainly shown.
Figure 11B:
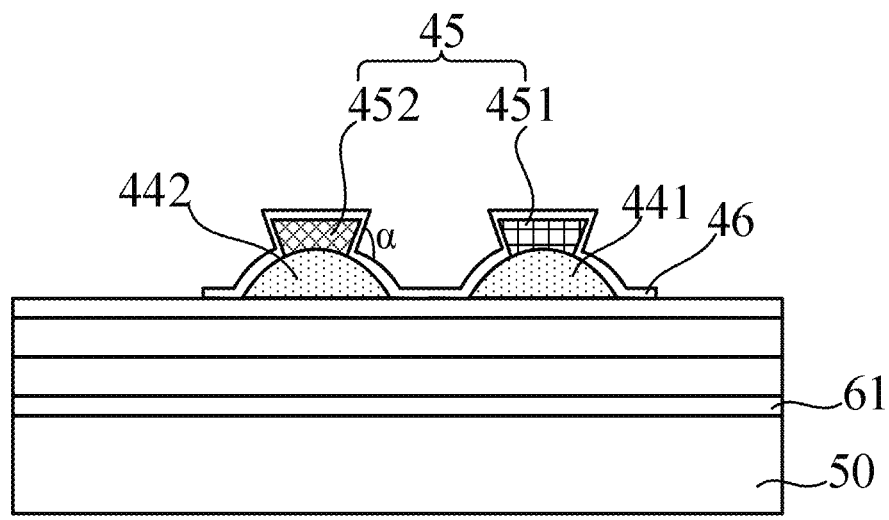

FIGS. 11A and 11B are respectively partial enlarged views of a cross-sectional view of a display substrate according to embodiments of the present disclosure, which mainly show the shape and relative positional relationship of the support layer and the post spacer. Referring to FIG. 11A, two post spacers 451 and 452 may share one support layer 44. The cross section of the support layer 44 in the direction perpendicular to the base substrate 50 may have a regular trapezoidal shape, that is, the area of the cross section of the support layer 44 in the direction parallel to the base substrate 50 gradually decreases in a direction away from the base substrate 50. Two post spacers 451, 452 or more post spacers are arranged on one support layer 44, and orthographic projections of the two post spacers 451, 452 or more post spacers on the base substrate 50 fall within the orthographic projection of the one support layer 44 on the base substrate 50.

Referring to FIG. 11B, the two post spacers 451 and 452 may each have a respective support layer. The support layer 44 may include a first support sub-layer 441 and a second support sub-layer 442, and the first support sub-layer 441 and the second support sub-layer 442 are located in the same layer. A cross section of each of the first support sub-layer 441 and the second support sub-layer 442 in the direction perpendicular to the base substrate 50 may have a regular trapezoidal or convex arc shape, that is, an area of the cross section of each of the first support sub-layer 441 and the second support sub-layer 442 in the direction parallel to the base substrate 50 gradually decreases in a direction away from the base substrate 50. The two post spacers 451, 452 or more post spacers are arranged on the respective support sub-layers, and the orthographic projections of the two post spacers 451, 452 or more post spacers on the base substrate 50 fall with orthographic projections of respective support sub-layers 441, 442 on the base substrate 50. As shown in FIG. 11B, a corner of the overcoat layer 46 covering the post spacer at a junction position where the post spacer is connected with the support sub-layer may have an obtuse angle, as shown by angle α in the drawing. With reference to FIGS. 6-8 and FIG. 11B in combination, it should be understood that corners of the first water blocking layer 531 and the second water blocking layer 533 covering the post spacer at the junction position where the post spacer is connected with the support sub-layer are also obtuse angles. In this way, the overcoat layer 46, the first water blocking layer 531, and the second water blocking layer 533 are not prone to stress concentration problems at the corners, thereby the overcoat layer 46, the first water blocking layer 531, and the second water blocking layer 533 are prevented from generating cracks at the corners. Therefore, with such a setting manner, the encapsulating reliability may be further improved.

Referring back to FIGS. 6-8, the display substrate may further include conductive traces 47. For example, the conductive traces 47 may be located in the first conductive layer, that is, the conductive traces 47 may be located in the same layer as the source electrode and drain electrode of the thin film transistor.

Referring back to FIG. 8, the display substrate may further include a blocking structure 48. For example, the blocking structure 48 may be disposed between the hole 43 and the post spacer 45, that is, an orthographic projection of the blocking structure 48 on the base substrate 50 is located between the orthographic projection of the hole 43 on the base substrate 50 and the orthographic projection of the post spacer 45 on the base substrate 50. The blocking structure 48 is also called a crack dam, and configured to block cracks from extending to the display light-emitting elements of the display substrate, thereby further improving the encapsulating reliability. For example, the blocking structure 48 may include a trench (i.e., a recess) provided in an insulating layer (for example, a gate insulating layer, an interlayer insulating layer, etc.) to form a crack dam for blocking expansion of cracks. Additionally or alternatively, the blocking structure 48 may include a blocking dam (i.e., a protrusion), which may be provided in the same layer as metal conductive layer (for example, a gate electrode) to form a crack dam for blocking the expansion of the cracks. In addition, at positions of the first water blocking layer 531 and the second water blocking layer 533 of the encapsulating structure 53 corresponding to the blocking structure 48, a recess or a protrusion may also be formed to block the expansion of the cracks.

Figure 12:
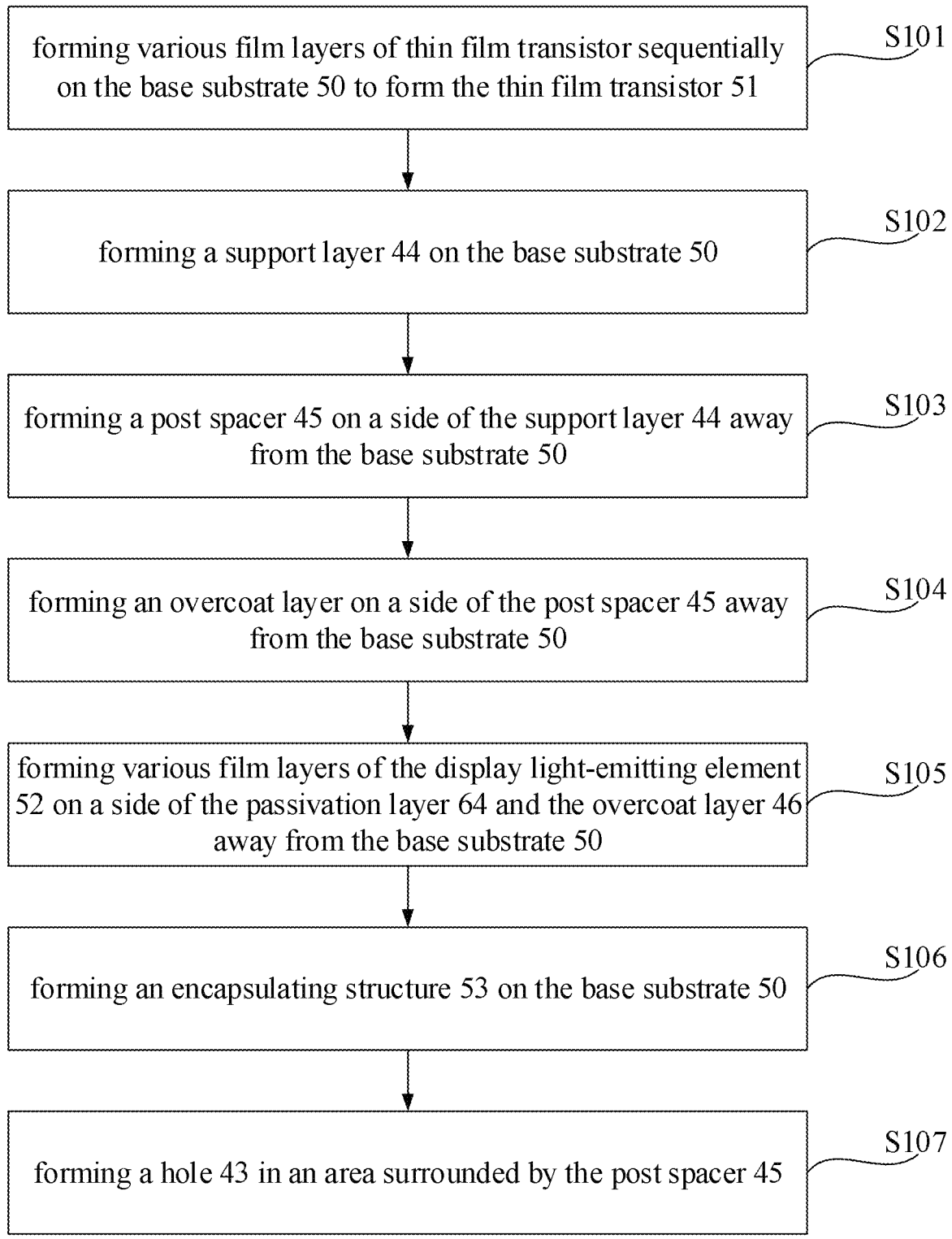
FIG. 12 is a flowchart of a manufacturing method of an electroluminescent display substrate according to exemplary embodiments of the present disclosure.

FIG. 12 is a flowchart of a manufacturing method of an electroluminescent display substrate according to embodiments of the present disclosure. With reference to FIGS. 6-8 and FIG. 12, the manufacturing method may be performed according to the following steps. It should be noted that, according to some embodiments of the present disclosure, some of the following steps may be executed individually or in combination, and may be executed in parallel or sequentially, and are not limited to the specific operation sequence described below.

In step S101, various film layers of the thin film transistor are sequentially formed on the base substrate 50 to form the thin film transistor 51.

In step S102, a support layer 44 is formed on the base substrate 50. For example, in this step, a planarization film layer may be formed on the side of the thin film transistor 51 away from the base substrate 50, and the first planarization layer 62 and the support layer 44 may be formed through one patterning process.

In step S103, a post spacer 45 is formed on a side of the support layer 44 away from the base substrate 50. For example, the material of the post spacer 45 may be photoresist, such as a negative photoresist, and the post spacer 45 may be obtained through a photolithography process.

Optionally, the cross section of the post spacer 45 in a direction perpendicular to the base substrate 50 may have an inverted trapezoid shape, an I-shape or a T-shape. That is, there is a convex structure on the side surface of the post spacer 45, that is, a cross section of the post spacer 45 in the direction parallel to the base substrate 50 at a first position has a first cross-sectional area, the cross section of the post spacer 45 in the direction parallel to the base substrate 50 at a second position has a second cross-sectional area, the first position is farther away from the support layer 44 than the second position, and the first cross-sectional area is larger than the second cross-sectional area.

In step S104, an overcoat layer is formed on a side of the post spacer 45 away from the base substrate 50.

For example, referring to FIG. 6, a conductive material film layer may be formed on a side of the first planarization layer 62 and the post spacer 45 away from the base substrate 50, and the second conductive layer 63 and the overcoat layer 46 may be formed by one patterning process. The second conductive layer 63 is electrically connected to the source electrode or drain electrode of the thin film transistor, and the overcoat layer 46 covers the post spacer 45 and the support layer 44.

For another example, referring to FIG. 7, a passivation material film layer may be formed on a side of the second conductive layer 63 away from the base substrate 50, and the passivation layer 64 and the overcoat layer 46 may be formed through one patterning process. The passivation layer 64 covers the second conductive layer 63, and the overcoat layer 46 covers the post spacer 45 and the support layer 44.

For another example, referring to FIG. 8, a conductive material film layer may be formed on a side of the first planarization layer 62 and the post spacer 45 away from the base substrate 50, and the second conductive layer 63 and the first overcoat sub-layer 461 may be formed through one patterning process. The second conductive layer 63 is electrically connected to the source electrode or drain electrode of the thin film transistor, and the first overcoat sub-layer 461 covers the post spacer 45 and the support layer 44. Then, a passivation material film layer is formed on a side of the second conductive layer 63 and the first overcoat sub-layer 461 away from the base substrate 50, and the passivation layer 64 and the second overcoat sub-layer 462 are formed through one patterning process. The passivation layer 64 covers the second conductive layer 63, and the second overcoat sub-layer 462 covers the post spacer 45 and the support layer 44.

In step S105, various film layers of the display light-emitting element 52 are formed on a side of the passivation layer 64 and the overcoat layer 46 away from the base substrate 50.

For example, the anode, the light-emitting layer, and the cathode of the display light-emitting element 52 may be sequentially formed, and the anode, the light-emitting layer, and the cathode of the display light-emitting element 52 may not be formed at a position where the hole is to be formed. The light-emitting layer and the cathode of the display light-emitting element 52 may be formed by an evaporation process. As the post spacer 45 has a structure of wide top and narrow bottom, the light-emitting layer and the cathode of the display light-emitting element 52 may be disconnected at the post spacer 45 to prevent the water vapor and oxygen from invading the interior of the display light-emitting elements along the film layers of the display light-emitting elements.

In step S106, an encapsulating structure 53 is formed on the base substrate 50.

For example, the encapsulating structure 53 may include a first water blocking layer 531, a second planarization layer 532, and a second water blocking layer 533 arranged in sequence. For example, the first water blocking layer 531 and the second water blocking layer 533 may be composed of an inorganic material, and the second planarization layer 532 may be composed of an organic material. The first water blocking layer 531 and the second water blocking layer 533 cover the post spacer 45, and the second planarization layer 532 of the encapsulating structure 53 does not cover at least the post spacer closest to the hole 43.

In step S107, a hole 43 is formed in an area surrounded by the post spacer 45.

For example, laser, stamping, or other cutting methods may be used to remove portions of respective film layers and the base substrate in the area surrounded by the post spacer 45 to form the hole 43.

In the above manufacturing method, the support layer, the overcoat layer and other film layers may be formed through the same patterning process as the planarization layer, the conductive layer or the passivation layer. In this way, the encapsulating reliability of the display substrate may be improved without changing the existing process flow, which is beneficial to save equipment investment and reduce manufacturing costs.

It should be noted that the above-mentioned embodiments are only illustrative descriptions of the manufacturing methods according to the embodiments of the present disclosure. Without departing from the technical concept of the present disclosure, the specific execution process of each step or the order between the steps may be changed.

For example, in the step S103, the material of the post spacer may be selected as required, and the embodiments of the present disclosure do not intend to limit it. In addition, the post spacer may be fabricated through a separate step, or may be fabricated together with other film layers.

For example, in the step S106, since each film layer at the position where the hole is to be formed needs to be removed later, the pattern of the planarization layer may not be formed at the position corresponding to the hole to be formed, so that the material for the planarization layer may be saved, and the hole may be more easily formed by cutting. For example, the pattern of the planarization layer may be formed by inkjet printing.

For example, a blocking structure 48 may also be formed between the hole and the corresponding post spacer.

It should be understood that the above-mentioned manufacturing method provided by the embodiments of the present disclosure should have the same characteristics and advantages as the display substrate provided by the embodiments of the present disclosure. Therefore, the characteristics and advantages of the above-mentioned manufacturing method provided by the embodiments of the present disclosure may be referred to the characteristics and advantages of the display substrate described above, which will not be repeated here.

Figure 13:
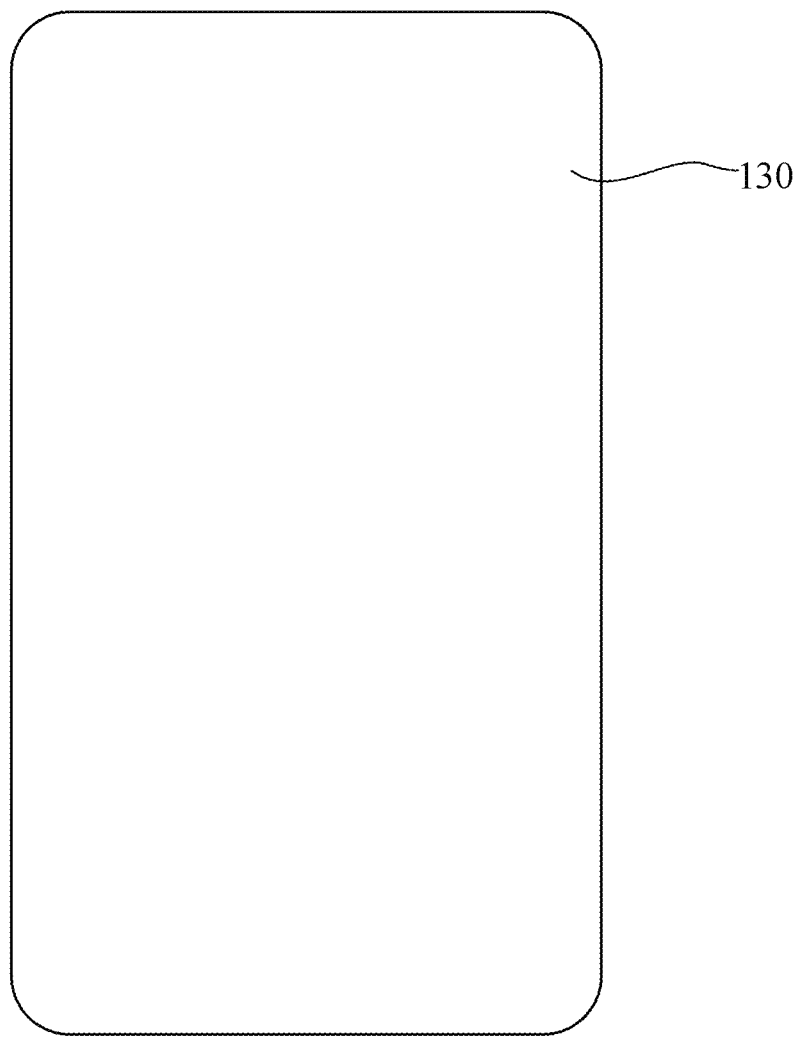
FIG. 13 is a schematic plan view of an electroluminescent display device according to exemplary embodiments of the present disclosure.

In addition, embodiments of the present disclosure also provide a display device, including the electroluminescent display substrate provided by the above-mentioned embodiments. As shown in FIG. 13, it shows a plan view of a display device according to embodiments of the present disclosure, the display device 130 may include the display substrate described in any one of the above embodiments, and in particular, it may be a type of display device with at least one hole. For example, the display device may be any product or part with a display function, such as a smart phone, a wearable smart watch, smart glasses, a tablet computer, a television, a monitor, a notebook computer, a digital photo frame, a navigator, a car monitor, an e-book, etc.

Although some embodiments of the general concept of the present disclosure have been illustrated and described, those of ordinary skill in the art will understand that changes may be made to these embodiments without departing from the principles and spirit of the general concept of the present disclosure. The scope of the present disclosure shall be defined by the claims and their equivalents.

What is claimed is:

1. An electroluminescent display substrate, comprising:
a base substrate;
a thin film transistor on the base substrate;
a display light-emitting element disposed on the base substrate and located on a side of the thin film transistor away from the base substrate;
an inorganic material layer disposed on the base substrate and located between the thin film transistor and the display light-emitting element;
an encapsulating structure disposed on the base substrate and covering the display light-emitting element;
a hole, the hole at least penetrating the encapsulating structure;
at least one post spacer on the base substrate, the at least one post spacer surrounding the hole; and
an overcoat layer disposed on the base substrate and covering the at least one post spacer,
wherein an orthographic projection of the inorganic material layer on the base substrate at least partially overlaps with an orthographic projection of the thin film transistor on the base substrate, an orthographic projection of the at least one post spacer on the base substrate falls within an orthographic projection of the overcoat layer on the base substrate, a material of the overcoat layer is the same as that of the inorganic material layer, and the overcoat layer is located in the same layer as the inorganic material layer;
wherein the electroluminescent display substrate further comprises: a first planarization layer disposed between the thin film transistor and the inorganic material layer and covering the thin film transistor; and a support layer disposed between the base substrate and the post spacer and supporting the post spacer, wherein the first planarization layer and the support layer are located in the same layer and contain the same material;

wherein the encapsulating structure comprises: a first water blocking layer on a side of the display light-emitting element away from the base substrate: a second planarization layer on a side of the first water blocking layer away from the base substrate; and a second water blocking layer on a side of the second planarization layer away from the base substrate;

wherein the first water blocking layer and the second water blocking layer comprise an inorganic material, and the second planarization layer comprises an organic material; and wherein an orthographic projection of each of the first water blocking layer and the second water blocking layer on the base substrate covers an orthographic projection of each of the overcoat layer, the post spacer and the support layer on the base substrate.

2. The electroluminescent display substrate according to claim 1, wherein the thin film transistor comprises a source electrode and a drain electrode, and the source electrode and the drain electrode are located in a first conductive layer;

the inorganic material layer comprises a second conductive layer, the display light-emitting element comprises an anode and a cathode, and the second conductive layer electrically connects the source electrode or the drain electrode to the anode or cathode of the display light-emitting element.

3. The electroluminescent display substrate according to claim 1, wherein the inorganic material layer comprises a passivation layer between the thin film transistor and the display light-emitting element.

4. The electroluminescent display substrate according to claim 2, wherein the inorganic material layer further comprises a passivation layer between the thin film transistor and the display light-emitting element; and wherein the overcoat layer comprises a first overcoat sub-layer and a second overcoat sub-layer, the first overcoat sub-layer and the second conductive layer are located in the same layer, and the second overcoat sub-layer and the passivation layer are located in the same layer.

5. The electroluminescent display substrate according to claim 1, wherein the overcoat layer contacts a first side surface, a second side surface and a top surface of each post spacer, the first side of the post spacer is a side of the post spacer close to the hole, the second side of the post spacer is a side of the post spacer away from the hole, and the top surface of the post spacer is a surface of the post spacer away from the base substrate.

6. The electroluminescent display substrate according to claim 1, wherein the orthographic projection of the at least one post spacer on the base substrate falls within an orthographic projection of the support layer on the base substrate.

7. The electroluminescent display substrate according to claim 1, wherein an orthographic projection of the support layer on the base substrate falls within the orthographic projection of the overcoat layer on the base substrate, and the overcoat layer covers both the post spacer and the support layer.

8. The electroluminescent display substrate according to claim 1, wherein an orthographic projection of one post spacer of the at least one post spacer closest to the hole on the base substrate does not overlap with an orthographic projection of the second planarization layer on the base substrate.

9. The electroluminescent display substrate according to claim 1, wherein a cross section of each post spacer in a direction perpendicular to the base substrate has a shape selected from an inverted trapezoid shape, an I-shape or a T-shape.

10. The electroluminescent display substrate according to claim 9, wherein the display light-emitting element comprises an anode, a cathode, and a light-emitting layer sandwiched between the anode and the cathode, and at least one of the light-emitting layer and the cathode is disconnected at each post spacer.

11. The electroluminescent display substrate according to claim 7, wherein the at least one post spacer comprises two or more post spacers, and the two or more post spacers are disposed on the same support layer.

12. The electroluminescent display substrate according to claim 7, wherein the at least one post spacer comprises two or more post spacers, the support layer comprises two or more support sub-layers, and the two or more support sub-layers support the two or more post spacers, respectively, so that a corner of the overcoat layer at a junction where each support sub-layer is connected with the post spacer supported by the support sub-layer has an obtuse angle.

13. The electroluminescent display substrate according to claim 1, wherein each post spacer comprises a photoresist material.

14. The electroluminescent display substrate according to claim 2, wherein the second conductive layer and the first conductive layer comprise the same material.

15. An electroluminescent display device comprising the electroluminescent display substrate according to claim 1.

16. A manufacturing method of an electroluminescent display substrate, comprising:

forming a thin film transistor on a base substrate;

forming a planarization film layer on a side of the thin film transistor away from the base substrate, and then forming a first planarization layer and a support layer through one patterning process;

forming a post spacer on a side of the support layer away from the base substrate;

forming an inorganic material film layer on a side of the first planarization layer and the post spacer away from the base substrate, and then forming an inorganic material layer and an overcoat layer through one patterning process;

forming a display light-emitting element on a side of the inorganic material layer and the overcoat layer away from the base substrate;

forming an encapsulating structure on a side of the display light-emitting element away from the base substrate; and forming a hole that at least penetrates the encapsulating structure in an area surrounded by the post spacer, wherein an orthographic projection of the inorganic material layer on the base substrate at least partially overlaps with an orthographic projection of the thin film transistor on the base substrate, and an orthographic projection of the post spacer on the base substrate falls within an orthographic projection of the overcoat layer on the base substrate, wherein the encapsulating structure comprises: a first water blocking layer on a side of the display light-emitting element away from the base substrate; a second planarization layer on a side of the first water blocking layer away from the base substrate; and a second water blocking layer on a side of the second planarization layer away from the base substrate;

wherein the first water blocking layer and the second water blocking layer comprise an inorganic material, and the second planarization layer comprises an organic material; and wherein an orthographic projection of each of the first water blocking layer and the second water blocking layer on the base substrate covers an orthographic projection of each of the overcoat layer, the post spacer and the support layer on the base substrate.

17. The manufacturing method according to claim 16, wherein the thin film transistor comprises a source electrode and a drain electrode, and the source electrode and the drain electrode are located in the first conductive layer;

the inorganic material layer comprises a second conductive layer, the display light-emitting element comprises an anode and a cathode, and the second conductive layer electrically connects the source electrode or the drain electrode to the anode or cathode of the display light-emitting element;

the inorganic material layer further comprises a passivation layer between the thin film transistor and the display light-emitting element; and wherein the overcoat layer comprises a first overcoat sub-layer and a second overcoat sub-layer, the first overcoat sub-layer and the second conductive layer are located in the same layer, and the second overcoat sub-layer and the passivation layer are located in the same layer.

18. The manufacturing method according to claim 16, wherein the inorganic material layer comprises a passivation layer between the thin film transistor and the display light-emitting element.

\* \* \* \* \*